United States Patent [19]

Hashimoto et al.

[11] Patent Number: 4,882,710

[45] Date of Patent: Nov. 21, 1989

[54] FIFO MEMORY INCLUDING DYNAMIC MEMORY ELEMENTS

[75] Inventors: Masashi Hashimoto, Ami; Kenji Sasaki, Kukizaki; Masayoshi Nomura, Tsuchiura, all of Japan

[73] Assignee: Texas Instruments Incorporated, Dallas, Tex.

[21] Appl. No.: 94,943

[22] Filed: Sep. 9, 1987

[30] Foreign Application Priority Data

Sep. 18, 1986 [JP] Japan ............................ 61-220270

[51] Int. Cl.$^4$ ..................... G11C 7/00; G09G 1/02
[52] U.S. Cl. ....................... 365/189.05; 365/219; 365/221; 365/222; 340/799
[58] Field of Search ............. 365/221, 189, 239, 240, 365/78, 222, 219; 340/750, 799, 800, 802

[56] References Cited

U.S. PATENT DOCUMENTS

| | | | |
|---|---|---|---|
| 4,535,427 | 8/1985 | Jiang | 365/221 |
| 4,547,867 | 10/1985 | Reese et al. | 365/222 |
| 4,646,270 | 2/1987 | Voss | 365/221 |
| 4,648,032 | 3/1987 | Romero, Jr. et al. | 365/222 |

OTHER PUBLICATIONS

Pai, "FIFO RAM Controller Tackles Deep Data Buffering", Computer Design, Aug. 1, 1986, pp. 109-112.
Tunick, "Rich with Logic, Memory ICs Hone Their Specialties", Electronic Design, Jun. 11, 1987, pp. 77-86.
"A 1 Mb DRAM with 33 MHz Serial I/O Ports'-'—Ohta et al., IEEE International Solid-State Circuits Conference, pp. 274-275, (Feb. 21, 1986), with Related Product Description, 1 MBit Image Memory MN4700 Product Description.
"1985 Memory Products Databook"—NEC Electronics Inc., μPD41221 224,000-Bit Serial-Access NMOS RAM, pp. 3-21 through 3-25, (Jan. 1985).
"1986 Memory Databook"—NEC Electronics Inc., μPD41221 224,000-Bit Serial-Access NMOS RAM, pp. 3-25 through 3-31, (Apr. 1986).

Primary Examiner—Glenn A. Gossage
Attorney, Agent, or Firm—William E. Hiller; N. Rhys Merrett; Melvin Sharp

[57] ABSTRACT

A FIFO memory is provided with individual arrays of dynamic memory cells and includes a dedicated write line buffer memory and a dedicated read line buffer memory operably connected thereto. First and second line buffer memories are also provided in conjunction with the write line buffer memory and the read line buffer memory so as to permit a faster response to the input and output of data with respect to the FIFO memory. Data may be alternately written into either one of the line buffer memories as a lead-in to the subsequent writing of data in the dynamic memory arrays via the write line buffer memory. Data read out from the other line buffer memory may occur simultaneously. The FIFO memory may serve as a video data frame memory for storing a frame of a video screen image. Where video data is continuously written into the FIFO memory, either the preceding video data frame or the current video data frame that is being written is subject to read out depending on the timing of a read reset signal relative to the last write reset signal. The write line buffer memory and the read line buffer memory are operable independently of each other, and may have simultaneous cycle times without any synchronization therebetween. The first and second line buffer memories preferably comprise static type memory elements to facilitate rapid data read out therefrom in response to a read reset signal.

9 Claims, 6 Drawing Sheets

FIFO MEMORY INCLUDING DYNAMIC MEMORY ELEMENTS

BACKGROUND OF THE INVENTION

1. Field of the Invention

The present invention relates to a semiconductor memory device.

2. Description of the Prior Art

As the FIFO (First In First Out) memory device, for example, two commercial products are known under names, μPD41101C and CXK1202S, respectively. Also some FIFO memory devices have been disclosed in the last 1986 national conference of the Institute of Electronics and Communication Engineers of Japan. When disclosed, all these devices are designated as the line memory. Though characterized by fast operation with read and write cycles as short as around 30 nsec, these devices have modest storage capacities of about 2 kbits per port at most.

To increase the storage capacity, the circuit configuration of memory elements must be simplified as much as possible to allow for higher circuit integration. Being designed for a memory configuration similar to the static RAM (Random Access Memory), however, the above FIFO memory devices, though simple to control for read and write and capable of readily achieving high speed operation, have a problem with respect to high circuit integration.

OBJECTS AND SUMMARY OF THE INVENTION

Accordingly, an object of the present invention is to provide a semiconductor memory device comprising a low cost FIFO memory that can be designed not only for high memory capacity through high circuit integration but high speed operation.

Namely, the invention relates to a semiconductor memory device comprising a FIFO memory whose main memory elements are of dynamic type.

Figure 4:
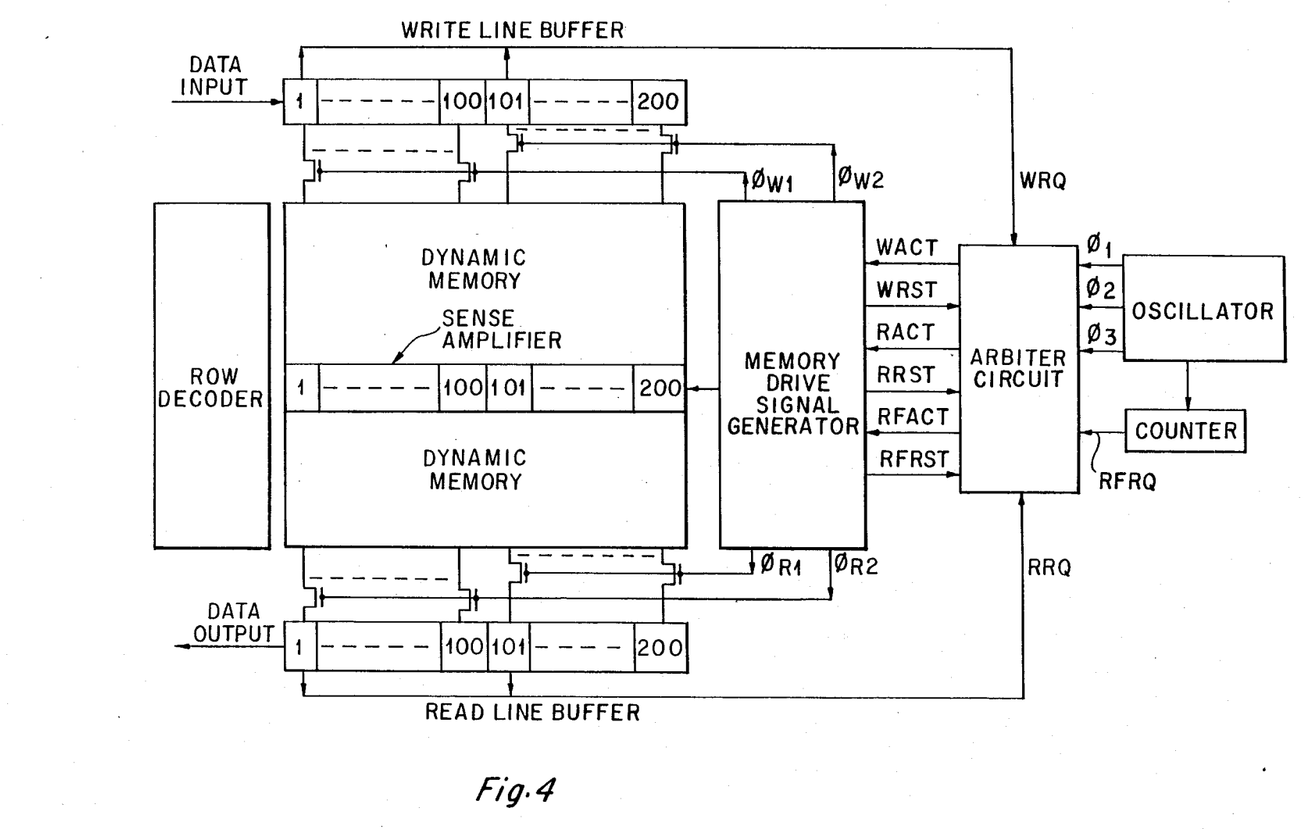
FIG. 4 is a circuit diagram of a semiconductor memory device as disclosed in copending U.S. application Ser. No. 083,555 filed August 7, 1987 which is given as a reference example to serve as a background for the present invention as illustrated in FIGS. 1A, 1B, 2 and 3.

To have a high capacity FIFO memory, concretely speaking, the device of the invention preferably satisfies the following six points:

(1) The main memory comprises unitransistor type memory cells as fabricated on the DRAM (Dynamic Random Access Memory) device that allows high circuit integration and production at a rather low cost;

(2) An internal self-control circuit as shown in FIG. 4 is provided to allow for the refresh and precharge control, which the user is responsible for with the ordinary DRAM;

(3) A dedicated write line buffer is provided so the data write cycle time can be freely set in a wide range from low speed ($10^{-4}$ to $10^{-3}$ sec) to high speed operation ($30 \times 10^{-9}$ sec);

(4) A dedicated read line buffer is provided to read data at a cycle time that can be set in the same range as the data write cycle time but without any synchronization with the write line buffer;

(5) An additional static type line buffer or buffers are provided to allow for faster response to the reset (return to head address) signal; and (6) A defective bit relief circuit is provided to improve the yield of device production.

Other objects, features and advantages of the invention will appear more fully from the following detailed description thereof taken in connection with the accompanying drawings.

DESCRIPTION OF THE PREFERRED EMBODIMENTS

First, the semiconductor memory device as disclosed in copending U.S. application Ser. No. 083,555 filed August 7, 1987 which provides a background for the present invention will be described below with reference to FIGS. 4-6. This device comprises a DRAM as main memory and an internal circuit to refresh such memory without control of any external signal. Namely, the basic design of the device is provided with line buffers for serial-parallel and parallel-serial conversion of data, further having a ring oscillator or oscillators or a similar oscillator or oscillators, a counter or counters to count oscillation pulses from such oscillators, a mechanism to generate the read and write request signals, a circuit to generate the refresh signal, and an arbiter circuit to determine priority between read, write and refresh signals as these signals are generated depending on circumstances.

In FIG. 4, in consideration of descriptional convenience, it is assumed that there are provided a parallel array of 200 sense amplifiers arranged in parallel relation to the rows of dynamic memory elements with the write and read line buffers connected to these sense amplifiers for parallel input and output, respectively. There is continuous input of serial data to the write line buffer with serial data read out from the read line buffer for continuous output. For these input and output circuits, any known means for serial data input and output, respectively, with a special addressing circuit built in may be used. Such input and output circuits may also be materialized otherwise, for example, by an approach as applied to the VRAM (Video RAM). Accordingly, the explanation about the operation of line buffers is omitted herein.

Data is written by the following sequence of steps (1) to (6):

(1) Data is written into the write line buffer sequentially as these data are input serially from outside. Here a serial write clock may be used to operate the pointer for addressing control of input data. As 100th data has been written and at the start of the next 101th data write cycle, namely, when the pointer indicates the address 101, a write request signal WRQ (=1=true) is generated as shown in FIG. 5 to write 1st through 100th data stored in the write line buffer into the dynamic memory elements.

Figure 5:
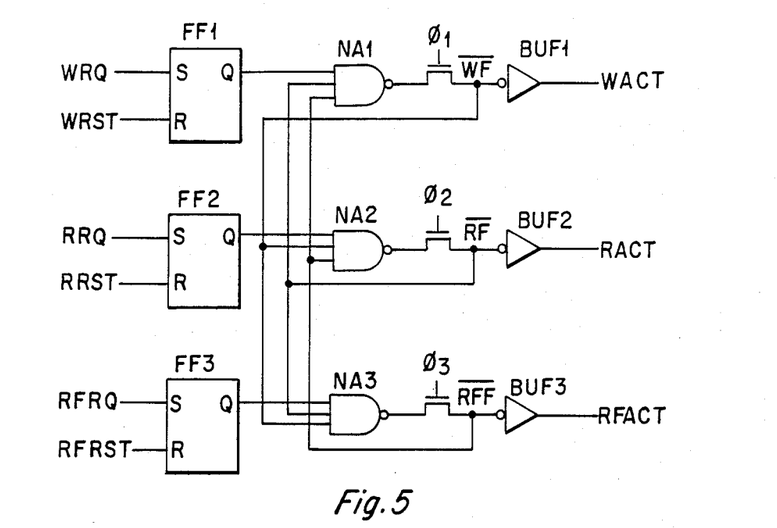
FIG. 5 is an equivalent circuit of the major part of an arbiter circuit used in the semiconductor memory device of FIG. 4.
Figure 6:
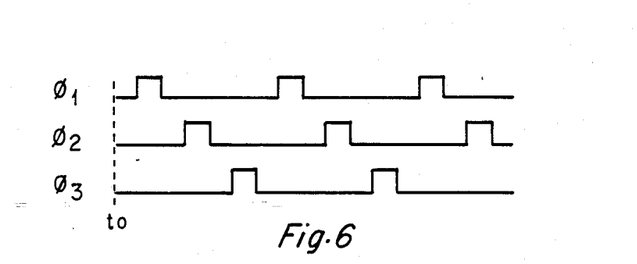
FIG. 6 is a timing chart of control signals applied to the arbiter circuit of FIG. 5.

(2) The signal WRQ is applied to the set terminal of the flip-flop FF1 of arbiter circuit as shown in FIG. 5. As the WRQ becomes true, the output terminal Q of FF1 is also set true. If the output Q of FF1 becomes true with both $\overline{RF}$ and $\overline{RFF}$ true, the output of NA1 is set false (=0), so $\overline{WF}$ is also set false at the timing of $\phi 1$. The write control signal WACT and also a memory driver signal $\phi w1$ of FIG. 4 are thus set true. The condition under which both $\overline{RF}$ and $\overline{RFF}$ are true will be mentioned later. It is noted that the circuit is designed in such a manner that $\phi w1$, $\phi w2$, $\phi R1$ and $\phi R2$ as shown in FIG. 4 are normally false. As the WACT is set true after the write pointer has counted up to 101 or counted up to 200 and then reset to 0, $\phi w1$ or $\phi w2$, respectively, is set true. Similarly, $\phi R1$ or $\phi R2$ is set true when the read pointer reaches 101 or 0, respectively.

(3) As the WACT signal becomes true, this signal is transmitted to the dynamic memory drive signal generator. Data is then written in the memory by the same operation as applied when data is written in the ordinary DRAM.

(4) After data is written, the dynamic memory drive signal generator generates a signal WRST (=1=true) to reset the WACT.

(5) This WRST is applied to the reset signal input terminal of FF1, returning Q back to the false state 0. As a result, the $\overline{WF}$ returns back to the true state 1 at the timing $\phi 1$.

(6) After the 200th data has been written, the write pointer returns back to the address No. 1 to write new input data from this address and at the same time a signal WRQ is generated to set the WACT and $\phi w2$ true by the same procedure.

Data is thus written continuously.

To read out data, 1st through 100th data are read and stored beforehand in the read line buffer and a read request signal RRQ is generated at the timing when the 1st data is read out. If both $\overline{WF}$ and $\overline{RFF}$ are true, $\overline{RF}$ then becomes false at the timing $\phi 2$ to set the RACT and $\phi R1$ true, starting an operational sequence to output 101th through 200th data to the read line buffer. Through similar operational sequences, a series of stored data can be continuously read out.

For refreshing, the oscillation frequency of an oscillator is divided by a proper counter to repeatedly generate a refresh request signal RFRQ at a proper cycle.

The approach as mentioned above has so far not been applied to the DRAM or the like for a reason as mentioned in the next paragraph. Some points that are important in embodying the invention will also be mentioned there.

The read and write timing control of DRAM has hitherto been a task that must be solved by the user himself. It is therefore not possible to forecast when write and read control signals are generated. Accordingly, as obvious from the circuit of FIG. 5, with the memory circuit configuration in which an approach of the present invention to generate the refresh request signal internally is used, once the refresh mode starts, any other request that may occur cannot be responded immediately but must wait until the ongoing refresh mode is completed. Since this leads to an increase in the access time, the above approach has not been feasible. If data is accessed serially, however, it is possible to forecast the timing when necessary data appears next. Therefore, if line buffers are built in to write and read data in batches of adequate size and if necessary data is, for example, read not by directly accessing the dynamic memory that operates rather slowly but serially through a line buffer fast enough, there will be no practical difficulty in reading data, for example, even if a read request signal is generated during the refresh mode and therefore data read from main memory starts after the end of ongoing refresh mode.

For example, let us assume 30 nsec for the maximum bit rate both for serial data reading and writing and 300 nsec for the cycle time to read, write or refresh data in the dynamic memory. For example, even when write, read and refresh requests to write, read and refresh, respectively, data in the dynamic memory are generated simultaneously and the read request is executed last, necessary data will always have been written in the read line buffer 900 nsec later. Accordingly, it is only necessary to generate a read request signal at least 30 bits earlier than when data becomes necessary. Namely, if the line buffer is designed for a storage capacity of 30 bits×2, namely, 60 bits, the memory will work without any difficulty in data reading.

If line buffers having a bit capacity based on a similar calculation are built in, therefore, a practically refresh-free memory of serial data access type will be materialized.

It is noted that in the example of FIG. 4 though data is read and written unsynchronously, an external clock may be used for synchronous write and read. Further, each line buffer is configured of memory units all in series but a modification is possible to have data Nos. 1 to 100 in parallel to data Nos. 101 to 200.

As mentioned above, the device of FIG. 4 is so designed that an internal circuit may refresh data without recourse to any external signal. So an efficient memory device can be provided which is capable of reading and writing data even in the refresh mode without any burden on user in designing the refresh control circuit.

According to the present invention, the aforementioned dynamic memory elements are used to comprise a FIFO memory device, which is very important.

Figure 1A:
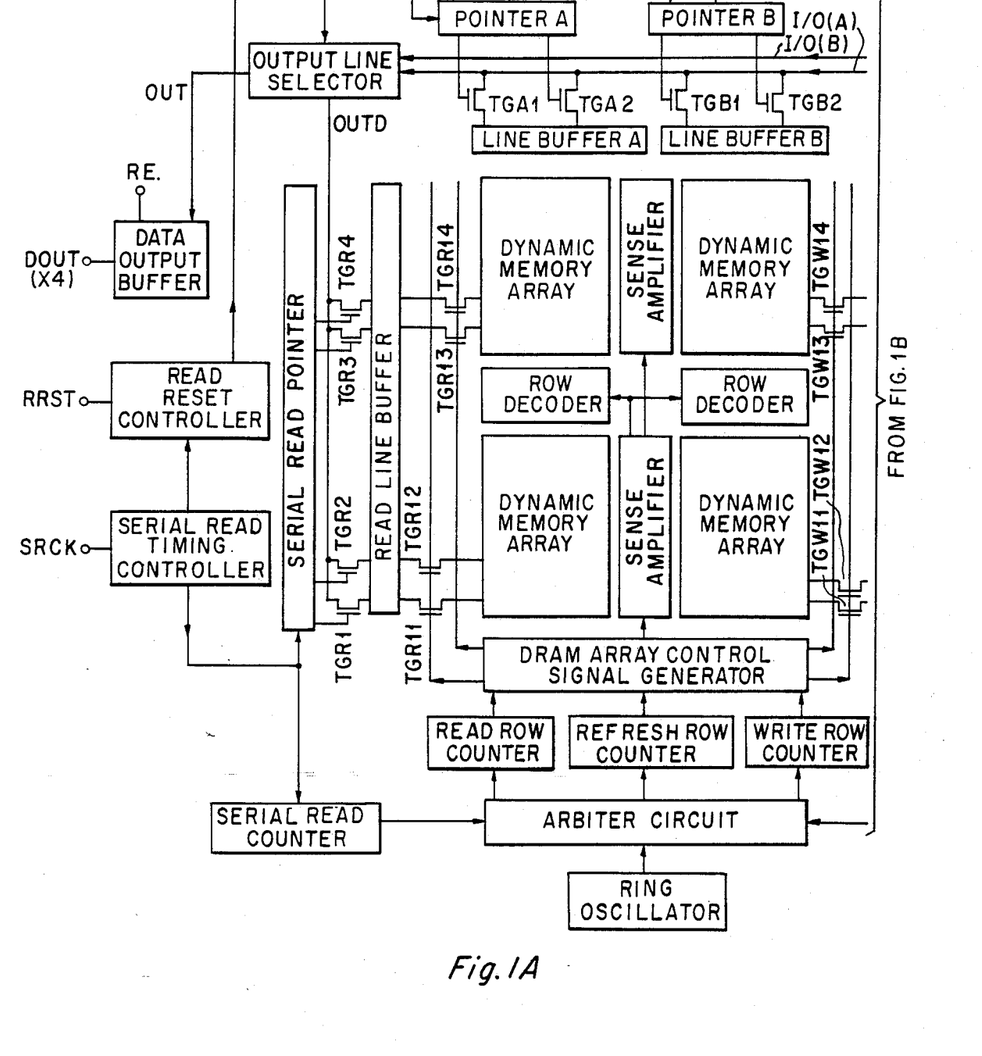
FIGS. 1A and 1B are a composite circuit diagram of a semiconductor memory device embodying the invention.
Figure 1B:
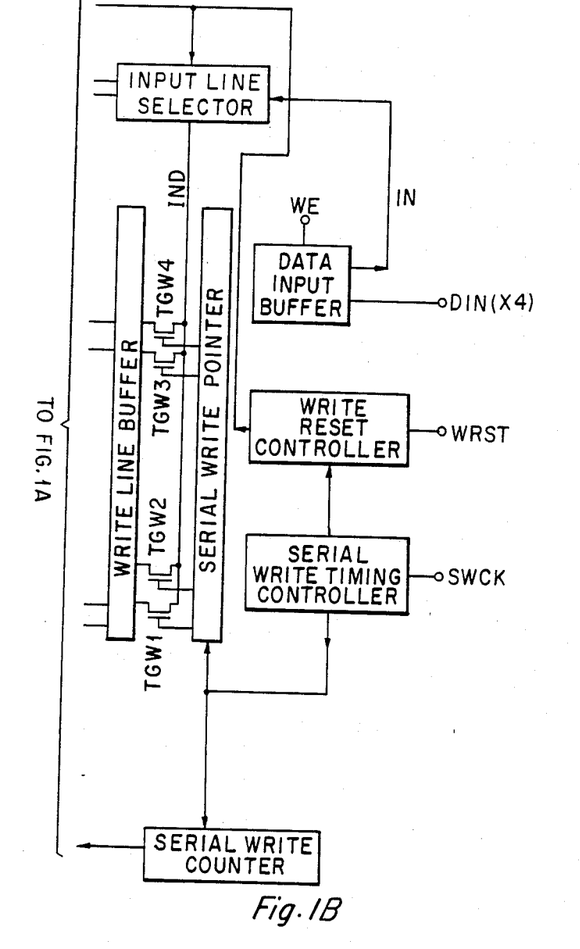

FIGS. 1A and 1B are a composite block diagram illustrating a circuit configuration of a FIFO semiconductor memory device embodying the present invention. When used as the ordinary FIFO memory, this device works in operational sequences as mentioned below. It is noted that in the present device data read and write ordinarily proceed independently of each other. Such independence will thus be assumed hereinafter unless otherwise stated.

Figure 2:
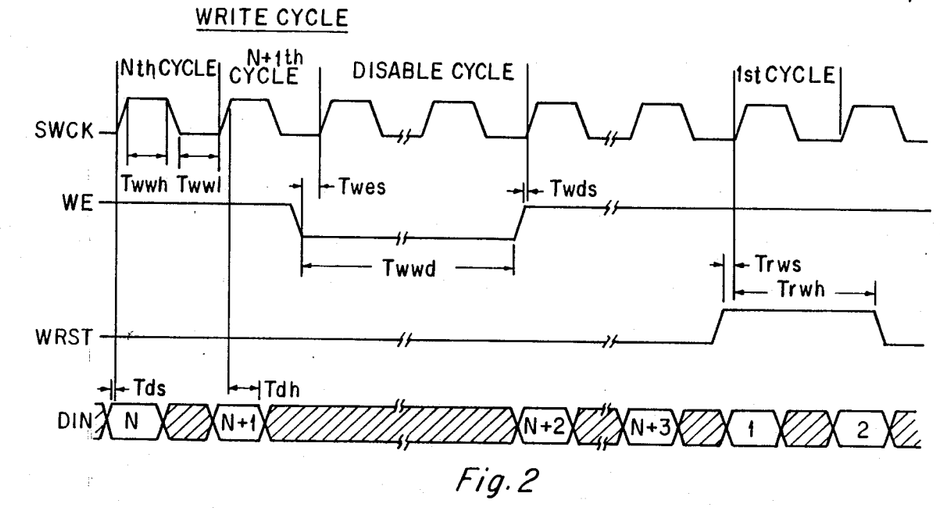
FIG. 2 is a timing chart of signals involved in the write operation of such device.

In FIGS. 1A and 1B, as long as the external input signal WE for data input control is kept high, input data from the data input terminal $D_{IN}$ is written as effective data in the present device. The write reset signal WRST is an input signal to indicate at the rise edge thereof a return to the first address (see FIG. 2) while the clock signal SWCK times the data write cycle.

As long as the external input signal RE for data output control is kept high, data is read out from the data output terminal $D_{OUT}$, under timing control of the serial read clock signal SRCK.

Figure 3:
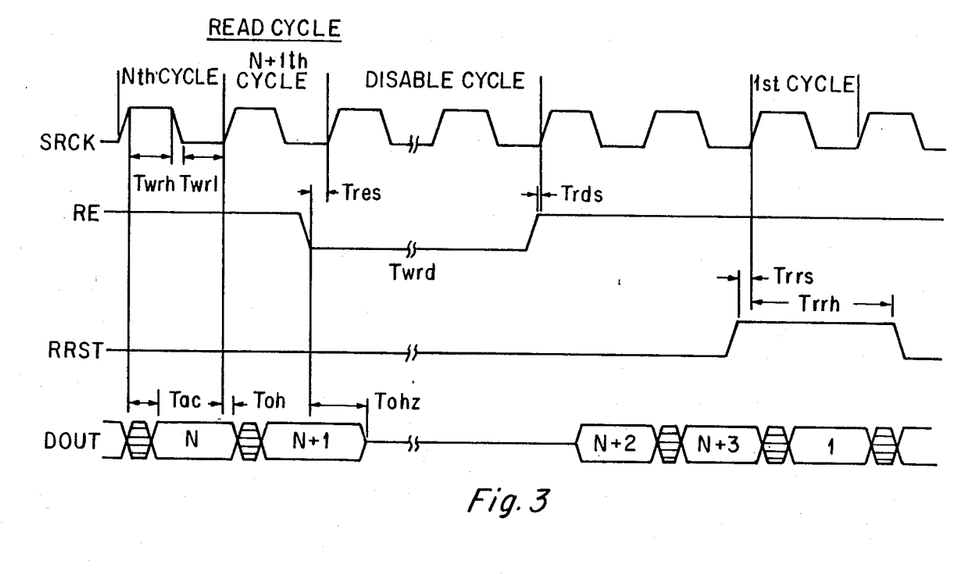
FIG. 3 is a timing chart of signals involved in the read operation of such device.

The read reset signal RRST is an input signal to indicate at the rising edge thereof a return to the first address (see FIG. 3).

Data write operation:

(1) First, the input signal WRST is switched from low to high to reset the data write address in the device to zero. Inside the device, the following operational sequence then proceeds. First, the rising edge of signal WRST is detected by a proper circuit to indicate appearance of such signal to the input line selector. Upon signal reception, this input line selector establishes electrical connection of two lines I/O(A) and IN with the lines I/O(B) and IND electrically disconnected from the line IN. Simultaneously, data transfer gates $T_{GB1}$ and $T_{GB2}$ on the line buffer B which are connected to the line I/O(B) and also data transfer gates $T_{GW1}$ to $T_{GW4}$ on the write line buffer which are connected to the line IND are all turned off. Namely, the pointer B and serial line pointer are reset while the pointer A indicates the address 0. The data transfer gate $T_{GA1}$ is now turned on. Data from the data input buffer is thus transmitted along the lines IN and I/O(A) and written at the address 0 of line buffer A.

(2) Timed by the clock SWCK, data is sequentially written at successive addresses of line buffer A.

(3) As the line buffer A gets full with data written at all the available addresses thereof, a data transmission route switching request is sent from the pointer A to the input line selector, so the latter disconnects the line I/O(A) from the line IN to and connects the line IN to the line IND.

(4) Timed by the clock SWCK, the serial write pointer sequentially turns on data transfer gates $T_{GW1}$ through $T_{GW4}$ on the write line buffer to write input data from the $D_{IN}$ in the write line buffer.

(5) The moment the serial write pointer turns on the $T_{GW3}$, a write request signal WRQ is generated and transmitted to the arbiter circuit to write data stored in the first half of write line buffer in the dynamic memory array. As for this part of device, detailed explanation is omitted since such explanation has already been given with reference to the circuit of FIG. 4.

(6) Subsequently, by increasing the address of row decoder step by step, data can be written sequentially up to the maximum capacity of DRAM.

If another reset request signal WRST is generated while data being written in the DRAM, this signal is likewise transmitted to the input line selector. This time, however, the line IN is connected to the line I/O(B) while being disconnected from lines I/O(A) and IND. As the line buffer B thus gets full with data written at all the available addresses, an operation similar to the above step (3) disconnects the line IN from the line I/O(B) and reconnects the line IN to the line IND. Data write thus proceeds as mentioned above.

Upon input of the next reset request signal WRST, the line IN is connected to the line I/O(A). Namely, the two lines I/O(A) and I/O(B) are alternately selected for connection to the line IN as when switched by a toggle switch.

Both line buffers A and B are composed of full-static memory elements. This design is deeply involved in the data read operation, so the reason why that design is selected will be given below in the following description of the data read operation.

Data read operation:

(1) The read reset signal RRST is switched from low to high to reset the data read address to zero inside the device. Internally, the rising edge of signal RRST is detected to indicate appearance of such signal to the output line selector and arbiter circuit. Upon signal reception, the output line selector connects either the line I/O(A) or I/O(B) to the line OUT. For this connection, if one of these lines I/O(A) or I/O(B) is being used for data write, the output line selector selects the other line that is vacant for connection. This means an assurance that if a signal WRST is followed by a signal RRST within a certain time, old data is read. As mentioned later, it is thereby intended that data may be consistently read from the main memory of dynamic type. Alternatively, in case neither the line I/O(A) nor I/O(B) is connected to the line IN, one of these two lines that has been used by the last WRST signal is connected to the line OUT. In this case, new data is to be read. Thereafter, each time the signal RRST appears, the same data will be repeatedly read out until the next WRST signal replaces such data with new. It is noted that since the signal RRST is an external signal input from outside by the operator, it cannot be forecast when the RRST will appear. For quick response to the signal RRST, the static memory is suitable for use since such memory allows to read data fast. This is the reason why the static type memory design is adopted for the line buffers A and B in the present example. Though the static type memory design lowers the degree of circuit integration, application of such design to the line buffers A and B, each having a memory capacity of around 100 bits, gives a negligibly small effect on the total dimensions of the device.

On the other hand, the signal RRST, as it transmitted to the arbiter circuit, generates a read request signal RRQ (see FIG. 4) to read data from the dynamic memory array into the read line buffer so necessary data may be read out in a necessary interval of time. This prepares for the data read after all data has been read out from a line buffer A or B that is currently being read.

(2) Timed by the clock SRCK, data is serially read out from the line buffer A or B until data is read out up to the last address thereof.

(3) A data transmission route switch request is then transmitted from the pointer A or B to the output line selector to connect the line OUTD to the line OUT.

(4) Since at the step (1) the first half of the read line buffer has already been loaded with data to be read out, data is now continuously read out through the line OUT without any interruption. The moment the read pointer turns on the $T_{GR1}$, another read request RRQ is generated and applied to the arbiter circuit to read necessary data from the dynamic memory array to the second half of read line buffer. The subsequent operation has already been described with reference to FIG. 4, so description thereof is omitted here.

It is noted that same data may be read out repeatedly by repeated input of the signal RRST.

The description of the basic operation of the semiconductor memory device of FIGS. 1A and 1B is now complete.

On the ideal FIFO memory, data read and write could have been completely independent of each other without any synchronization. Actually, however, the device has a limited memory capacity, so some restrictions are inevitably imposed on data read and write.

For easier understanding, an explanation will be given below with reference to an application of the FIFO memory device of the above example to read and write video data. It is assumed that this memory device has a memory capacity that corresponds to a frame of video data (according to the NTSC system that is the standard system in Japan, a frame of video screen image is composed of 525 scanning lines, so a frame of video data is composed of video data for such 525 scanning lines.)

As a frame of video data is sequentially written from the first to the last data thereof, the above memory device gets full. If video data is further written continuously to the device at this memory full state, namely, if it is continued to write data even after the first frame is switched to the second frame, data stored in the memory is successively replaced with data of the second frame from the top address. Of course, if the signal WE is set low to prohibit data write of the second and subsequent frames, the first frame of video data is kept stored and the same data can be read out any number of times by repeating the data read procedure.

The above explanation refers to the circuit configuration of FIGS. 1A and 1B. However, some modifications could very readily be materialized. For example, when the memory gets full, an internal signal may be generated to notice the operator of the memory full or data overwrite may be prohibited by creating the same internal state as if the signal WE were set low.

With the configuration of FIGS. 1A and 1B, in case data is written continuously as mentioned above, either the preceding frame (old data) or the current frame (new data) that is being written can be read depending on the timing of the RRST signal relative to the last WRST signal. How this timing affects the above frame selection for data read is determined by the memory capacity of the line buffers A and B. For example, if a memory capacity of 100 bits is assumed for each of these line buffers, generation of a RRST signal within 100 SWCK clock cycles after the last WRST results in output of old data.

Generation of a RRST signal later, namely, more than 100 SWCK clock cycles after the last WRST signal does however not always assure that new data will be read. This time, data transfer time in the main memory from the write line buffer to the memory array and from the memory array to the read line buffer is involved.

With the circuit configuration as described in detail with reference to FIG. 4 and under an assumption of a memory capacity of 200 bits for both of the write and read line buffers, new data will be read out under the following condition.

First, it is assumed that the first 100 bits of the new frame data are written in the line buffer A and the next 100 bits from 101th bit through 200th bit of the new frame data are written in the write line buffer from the address 1 through 100. The moment the 201th bit is written at the address 101 of the write line buffer, a write request WRQ is generated (as already mentioned). Since data transfer to the memory array is always complete before the 301th bit is written, new data will be read satisfactorily if a read request RRQ to request transfer of data 101th bit through 200th bit from the memory array to the read line buffer (resulting in input of a RRST signal as already mentioned) is generated when the 301th bit is written or later.

Namely, new data can be read out assuredly if a signal RRST is generated more than 300 SWCK clock cycles after generation of the last WRST signal (namely, after 300 bits of data have been written).

If a signal RRST should be generated 100 to 300 SWCK clock cycles after generation of the last WRST signal, no determination can be made as to which of the old and new data shall be read. In this time range, therefore, the operator is prohibited to generate any RRST signal.

Since data write and read need not be synchronous, the clock pulse width of SWCK and SRCK can be changed freely, except that to avoid mixing of old and new data or any other confusion, the clocks SWCK and SRCK must be set to such pulse widths that at any time when the clock SWCK is at the mth cycle after the occurrence of a WRST at the 0th cycle of this clock and the clock SRCK is at the nth cycle after the occurrence of a RRST at the 0th cycle of the second clock m and n must satisfy an inequality $m-n \leq 100$ or $m-n \geq 300$.

The detailed discussion of the defective bit relief circuit is omitted here, since it is obvious from the given circuit configuration of device that the basically known approach as applied to the VRAM (Video RAM) may be used for such relief circuit.

It will be evident that various modifications can be made to the described embodiments without departing from the scope of the present invention.

Because of use, as mentioned above, of a FIFO memory composed of dynamic memory elements, the invention can not only achieve high speed operation but materialize both higher circuit integration (namely, higher memory capacity) and lower production cost, merits of the dynamic memory.

What is claimed is:

1. A memory device capable of FIFO data operation, said memory device comprising:
   dynamic memory array means having a plurality of dynamic memory cells arranged in rows and columns;
   a write line buffer memory disposed on the input side and a read line buffer memory disposed on the output side of said dynamic memory array means for data transfer to and from said dynamic memory array means in a serial-parallel-serial arrangement to provide serial-parallel conversion of write data and parallel-serial conversion of read data;
   line buffer memory means;
   data input means connected to said line buffer memory means and to said write line buffer memory for selectively providing input data as write data to either said line buffer memory means or said write line buffer memory;
   data output means connected to said line buffer memory means and to said read line buffer memory for selectively receiving output data as readout data from either said line buffer memory means or said read line buffer memory; and
   control circuit means operably connected to said dynamic memory array means, said write line buffer memory, said read line buffer memory, said line buffer memory means, said data input means, and said data output means for regulating data transfer by connecting said line buffer memory means to said data input means and said data output means in tandem with connecting said write line buffer memory to said data input means and said read line buffer memory to said data output means.

2. A memory device as set forth in claim 1, wherein said line buffer memory means comprises first and second line buffer memories interposed between said data input means and said data output means and individually selectable in response to control signals actuating said control circuit means for alternately being connected to said data input means and said data output means such that either of said first and second line buffer memories may be connected to said data input means or said data output means at one time instant, and both of said first and second line buffer memories may be respectively connected to one and the other of said data input means and said data output means at another time instant.

3. A memory device as set forth in claim 1, wherein said line buffer memory means comprises at least one line buffer memory having a plurality of serially arranged static memory cells.

4. A memory device as set forth in claim 3, wherein said line buffer memory means comprises first and second line buffer memories, each having a plurality of serially arranged static memory cells.

5. A memory device capable of FIFO data operation, said memory device comprising:

dynamic memory array means having a plurality of dynamic memory cells arranged in rows and columns;

data input means operably connected to said dynamic memory array means;

data output means operably connected to said dynamic memory array means;

first and second line buffer memory means interposed between said data input means and said data output means;

input line selector means connected to said data input means, said input line selector means being disposed between said first and second line buffer memory means and said data input means;

output line selector means connected to said data output means, said output line selector means being disposed between said first and second line buffer memory means and said data output means;

first and second input/output lines connected to said input line selector means and said output line selector means and extending therebetween;

first and second data transfer means respectively disposed between said first line buffer memory means and said first input/output line and between said second line buffer memory means and said second input/output line;

a write line buffer memory operably connected to said dynamic memory array means;

a write line connected to said input line selector means and extending in juxtaposition to said write line buffer memory;

write data transfer means for operably connecting said write line to said write line buffer memory;

a read line buffer memory operably connected to said dynamic memory array means;

a read line connected to said output line selector means and extending in juxtaposition to said read line buffer memory;

read data transfer means operably connecting said read line to said read line buffer memory;

said data input means providing input data to said input line selector in response to a data input control signal received by said data input means;

said data output means providing data read out from said output line selector in response to a data read out control signal received by said data output means;

said input line selector means electrically connecting one of said first and second input/output lines to said data input means in response to a write reset control signal, the other of said first and second input/output lines being unconnected to said data input means;

the corresponding one of said first and second data transfer means electrically connecting the corresponding one of said first and second line buffer memory means to said electrically connected one of said first and second input/output lines in response to said write reset control signal, whereby data from said data input means is transmitted to said electrically connected one of said first and second line buffer memory means;

means sensing when said electrically connected one of said first and second line buffer memory means has been loaded with data to capacity and providing a switching control signal to said input line selector means, said input line selector means disconnecting said one of said first and second line buffer memory means from said data input means and connecting said data input means to said write line in response to said switching control signal;

means actuating said write data transfer means to connect said write line to said write line buffer memory when said data input means is connected to said write line, whereby data from said data input means is transmitted to said write line buffer memory; and control circuit means operably connected to said write line buffer memory and said dynamic memory array means for writing data stored in said write line buffer memory into said dynamic memory array means.

6. A memory device as set forth in claim 5, wherein said output line selector means electrically connects one of said first and second input/output lines to said data output means in response to a read reset control signal, the other of said first and second input/output lines being unconnected to said data output means;

the corresponding one of said first and second data transfer means electrically connecting the corresponding one of said first and second line buffer memory means to said electrically connected one of said first and second input/output lines in response to said read reset control signal, whereby data from said corresponding one of said first and second line buffer memory means electrically connected to said electrically connected one of said first and second input/output lines is transmitted to said data output means via said output line selector means for read out;

means sensing when said electrically connected one of said first and second line buffer memory means has been emptied in transmitting data via said output line selector means to said data output means and providing a switching control signal to said output line selector means;

said output line selector means disconnecting said one of said first and second line buffer memory means from said data output means and connecting said data output means to said read line in response to said switching control signal; and means actuating said read data transfer means to connect said read line to said read line buffer memory when said data output means is connected to said read line, whereby data from said dynamic array means is transmitted by said read line buffer memory via said output line selector means to said data output means as data read out.

7. A memory device as set forth in claim 6, wherein said first and second line buffer memory means respectively comprise a plurality of serially arranged static memory cells.

8. A memory device as set forth in claim 6, further including separate write and read timing means respectively operably connected to said write line buffer memory and said first and second line buffer memory means when one of said first and second line buffer memory means is operable in a write mode and to said read line buffer memory and said first and second line buffer memory means when one of said first and second line buffer memory means is operable in a read mode.

9. A memory device as set forth in claim 8, further including a serial write pointer operably connected to said write line buffer memory and to said write timing means;

a serial read pointer operably connected to said read line buffer memory and to said read timing means; and first and second pointers respectively operably connected to the corresponding first and second line buffer memory means and responsive to the write reset control signal and the read reset control signal for respectively initializing said first and second line buffer means to receive write data and transmit read data.

* * * * *